(12) United States Patent
Lin et al.

(10) Patent No.: US 8,184,226 B2
(45) Date of Patent: May 22, 2012

(54) THIN FILM TRANSISTOR STRUCTURE

(75) Inventors: Yu-Min Lin, Hsinchu (TW); Feng-Yuan Gan, Hsinchu (TW)

(73) Assignee: Au Optronics Corp., Hsinchu (TW)

( * ) Notice: Subject to any disclaimer, the term of this patent is extended or adjusted under 35 U.S.C. 154(b) by 439 days.

(21) Appl. No.: 11/849,593

(22) Filed: Sep. 4, 2007

(65) Prior Publication Data

US 2008/0135843 A1    Jun. 12, 2008

(30) Foreign Application Priority Data

Dec. 12, 2006   (TW) ................................ 95146465 A

(51) Int. Cl.
*G02F 1/136*   (2006.01)
*H01L 29/04*   (2006.01)
*H01L 29/10*   (2006.01)
*H01L 31/00*   (2006.01)

(52) U.S. Cl. .......................................... 349/48; 257/59

(58) Field of Classification Search ..................... 257/59; 349/48
See application file for complete search history.

(56) References Cited

U.S. PATENT DOCUMENTS

| | | | |
|---|---|---|---|
| 5,097,297 | A | 3/1992 | Nakazawa |
| 6,906,385 | B2 | 6/2005 | Moon et al. |
| 6,921,951 | B2 | 7/2005 | Lai |
| 7,084,934 | B2 | 8/2006 | Kim et al. |
| 7,130,000 | B2 | 10/2006 | Kim |
| 7,411,638 | B2 * | 8/2008 | Kim et al. ................. 349/43 |
| 7,554,622 | B2 * | 6/2009 | Nakanishi et al. .......... 349/48 |
| 2004/0125250 | A1 | 7/2004 | Park |

FOREIGN PATENT DOCUMENTS

| | | |
|---|---|---|
| JP | 2-285326 | 11/1990 |
| TW | 200507273 | 2/2005 |

OTHER PUBLICATIONS

Chinese language office action dated Sep. 23, 2009.
English language translation of abstract of TW 200507273.

* cited by examiner

*Primary Examiner* — Uyen Chau N Le
*Assistant Examiner* — John M Bedtelyon
(74) *Attorney, Agent, or Firm* — Thomas, Kayden, Horstemeyer & Risley, LLP

(57) ABSTRACT

A thin film transistor (TFT) structure is provided. The TFT comprises a gate, a first electrode, a second electrode, a dielectric layer, and a channel layer. By overlapping the area between the first electrode and the gate, the TFT structure acquires a parasitic capacitor that is unaffected by manufacture deviations. Therefore, the TFT needs no compensation capacitor, thereby, increasing the aperture ratio of the TFT.

11 Claims, 3 Drawing Sheets

THIN FILM TRANSISTOR STRUCTURE

CROSS-REFERENCES TO RELATED APPLICATIONS

This application claims priority to Taiwan Patent Application No. 095146465 filed on Dec. 12, 2006; the disclosures of which are incorporated herein by reference in their entirety.

STATEMENT REGARDING FEDERALLY SPONSORED RESEARCH OR DEVELOPMENT

Not applicable.

BACKGROUND OF THE INVENTION

1. Field of the Invention

The present invention relates to a TFT structure; specifically, it relates to a TFT structure for use in a TFT liquid crystal display.

2. Descriptions of the Related Art

In recent years, flat panel displays have gradually replaced conventional cathode ray tube displays. Current flat panel displays include: organic light-emitting diodes displays (OLEDs), plasma display panels (PDPs), liquid crystal displays (LCDs), field emission displays (FEDs), etc. An essential component of these flat panel displays is the thin-film transistor (TFT), which controls the on and off state of each pixel.

Stability is important to maintain during the panel manufacturing process to ensure good product quality and enhance manufacturing yield rates. However, during the manufacturing process, varying circumstantial conditions can cause the manufacturing parameters to deviate, resulting in electrical characteristic deviation in each TFT on the panel. For example, a parasitic capacitance of each TFT presents different distributions depending on the different areas of the panel. Because parasitic capacitances can occur all over the panel, non-uniform distributions of the parasitic capacitances will cause non-uniform distributions of the voltage jumps, resulting in the flickering of the screen.

To generally suppress the screen flickering, a compensating capacitor connected with the TFT has been designed to neighbor the original TFT for eliminating the effect of the TFT parasitic capacitance caused by the manufacturing process deviation. However, adding the compensating capacitor on the panel takes up space needed for lighting, and decreases the aperture ratio (i.e. the ratio between the pixel lighting area and total pixel area) accordingly. Moreover, a large compensating capacitor should not be used because it may result in an over range of the voltage jump.

In view of the above-mentioned issue, it is essential for the industry to provide a transistor structure for effectively reducing the area occupied by the compensating capacitors in circuit layouts.

SUMMARY OF THE INVENTION

One objective of this invention is to provide a TFT structure for use in a LCD. The TFT comprises a gate electrode, a first electrode, a second electrode, a dielectric layer and a channel layer. The gate electrode connects to the LCD scanning line and overlaps with the working area of the TFT structure. The first electrode is disposed on two sides of the working area. The second electrode is disposed in the center of the working area. The dielectric layer is disposed between the gate electrode and the working area. The channel layer is disposed under the first and the second electrodes and is electrically connected to the first and the second electrodes. The first electrode is parallel to the second electrode in the working area, which overlaps with the gate electrode. One of the first electrodes and second electrodes are connected to the pixel electrode of the LCD, while the other electrodes are connected to the data line of the LCD.

Another objective of this invention is to provide a TFT structure for use in a LCD. The TFT comprises a gate electrode, a first electrode, a second electrode, a dielectric layer and a channel layer. The gate electrode connects to the LCD scanning line and overlaps with the working area of the TFT structure. The first electrode includes two branches disposed on the center area of the working area. The second electrode includes three branches respectively disposed in the center, as well as two sides of the working area. The dielectric layer is disposed between the gate electrode and the working area. The channel layer is disposed under the first and the second electrodes and is electrically connected to the first and the second electrodes. The branches of the second electrode are disposed on two sides of the branches of the first electrode respectively. The first electrode is parallel to the second electrode in the working area, which overlaps with the gate electrode. One of the first electrode and the second electrode is connected to the pixel electrode of the LCD, while the others thereof are connected to the data line of the LCD.

The invention provides stability to the TFT, thereby preventing deviation and parasitic capacitance in the manufacturing process. Meanwhile, since no extra compensating capacitor is required, the parasitic capacitance will not increase significantly when the TFT structure area is increased to obtain a higher conduction current.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

Figure 1:
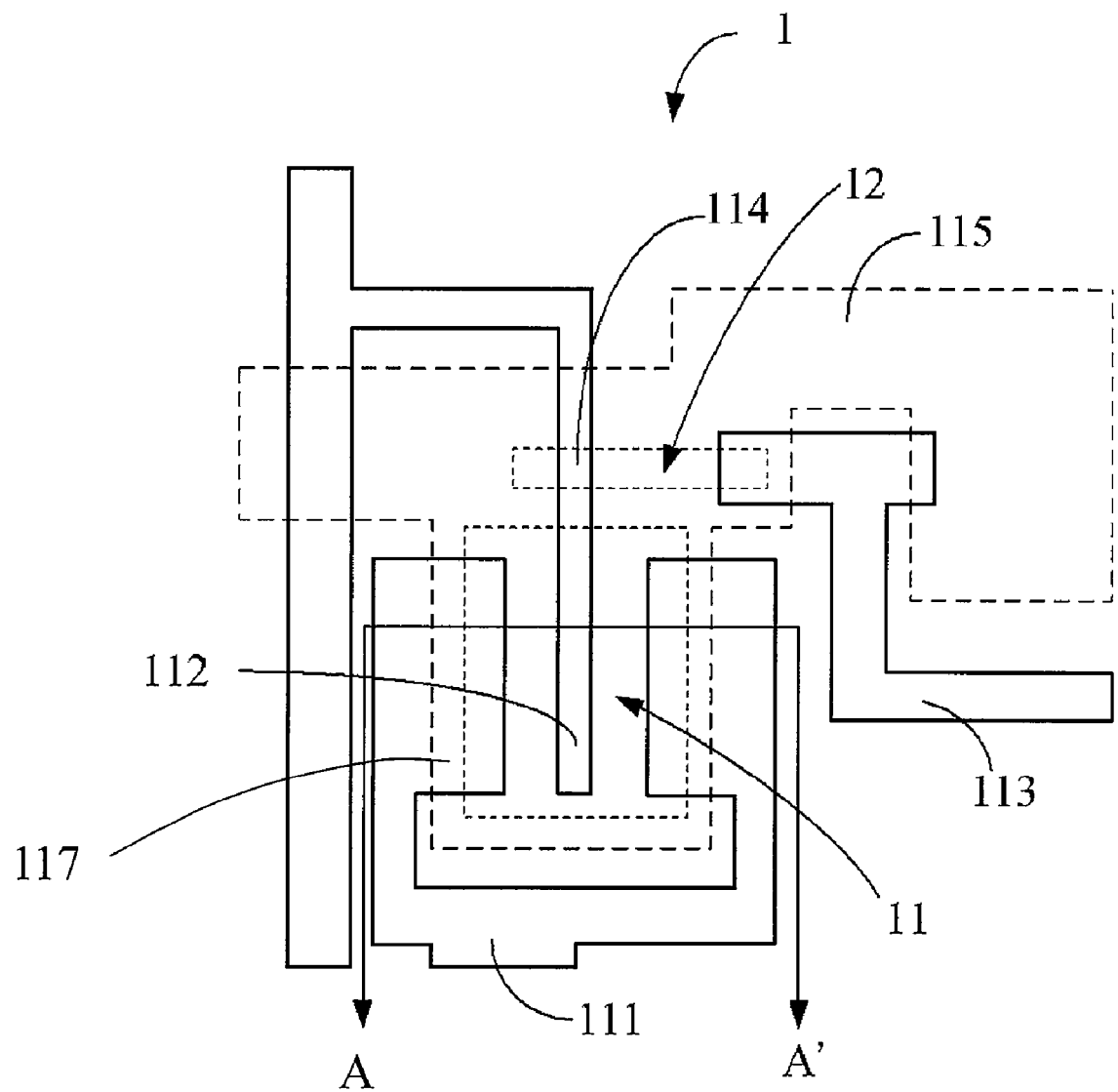
FIG. 1 is a schematic diagram illustrating the top view of a first embodiment of the invention.

FIG. 1 is a schematic diagram illustrating the top view of a TFT structure 1 of a first embodiment of the invention is shown. The TFT structure 1 comprises a primary TFT 11 and an auxiliary TFT 12. The primary TFT 11 and the auxiliary TFT 12 are electrically connected to each other in parallel and share a gate electrode 115. The primary TFT 11 comprises a first electrode 111 and a second electrode 112, and both electrodes connect to a drain and the source of the primary TFT 11, respectively, wherein the second electrode 112 comprises a horizontal size, i.e. a width. The auxiliary TFT 12 comprises a third electrode 113 and a fourth electrode 114, both connect to the drain and the source of the auxiliary TFT 12 respectively. The second electrode 112 electrically connects to the fourth electrode 114, while the first electrode 111 and the third electrode 113 connect to different pixel electrodes (not shown). Meanwhile, the second electrode 112 connects to a data line (not shown). In this embodiment and the following embodiment, the only difference between the source and the drain is their names for representing providing and receiving terminals of holes or electrons without any substantial manufacturing process difference.

In this embodiment, within the area overlapping the gate electrode 115, a working area is formed between the channel, which is located between the drain and the source, and the gate electrode 115. The first electrode 111 is parallel to the second electrode 112 for maintaining uniformity of the TFT channel lengths. The first electrode 111 overlaps with the gate electrode 115 in a direction parallel to the channel and extends outside the working area. That is, the first electrode 111 overlaps with the working area and extends outside the working area. In this embodiment, the overlapping area of the first electrode 111 and the gate electrode 115 comprises a horizontal size, i.e. a width, of about 1~10 μm, preferably 4~7 μm. Meanwhile, the second electrode 112 also comprises a horizontal size, i.e. a width, of about 1~10 μm, preferably 4~7 μm. When the manufacturing process parameters deviate, such as the case resulting from the misalignment of the manufacturing process for the first electrode 111, the left side portion of the first electrode 111 that extends outside the working area may deviate to the right. Meanwhile, the right side of the first electrode 111 that extends outside the working area may deviate to the right synchronously. Consequently, the total overlap area of the first electrode 111 remains the same. Similarly, the total overlap area of the first electrode 111 and the gate electrode 115 remains the same as well. The capacitance value of the flat type capacitors is decided by the overlapping area between the upper and lower electrode of the capacitor and the dielectric layer therebetween. Thus, the total overlap between the first electrode 111 and the gate electrode 115 remains constant, and as a result, the parasitic capacitance between the gate and the drain of the primary TFT 11 is stable and not affected from the deviation generated from the manufacturing process.

Moreover, in this embodiment, the auxiliary TFT 12 also relies on the structure to maintain stable parasitic capacitance when deviation occurs during the manufacturing process. The fourth electrode 114 and the second electrode 112 of the auxiliary TFT 12 are connected directly. In the horizontal extension direction overlapping the working area and the third electrode 113 of the auxiliary TFT 12, the gate electrode 115 comprises an indented shape so that the center area does not overlap with the gate electrode 115. Only the two sides of the third electrode 113 and the gate electrode 115 form two overlaps when the third electrode 113 extends outside the working area. Herein, when manufacturing parameter deviation occurs, such as the deviation which results from the manufacturing misalignment of the third electrode 113, the whole third electrode 113 will be synchronously deviated. Consequently, the total overlap area of the first electrode 113 and the gate electrode 115 does not change and the parasitic capacitance between the gate and the drain of the auxiliary TFT 12 stay stable without being affected by the deviation generated during the manufacturing process.

In this embodiment, the primary objective of the first electrode 111 and the third electrode 113 is to maintain that the overlapping area overlapped by the electrodes 111, 113 and the gate electrode 115 will not be affected by the manufacturing process deviation. Consequently, the first electrode 111 and the third electrode 113 have to be designed to partially overlap with the gate electrode 115 and extend outside the gate electrode 115. In this embodiment, the first electrode 111 and the third electrode 113 extend out in a direction parallel to the channel. For different layouts, the first electrode 111 and the third electrode 113 can extend out in the direction normal to the channel as well.

Meanwhile, since no extra compensating capacitor is required, the parasitic capacitance will not increase significantly when the TFT structure area is enlarged to obtain a higher conduction current.

Figure 2:
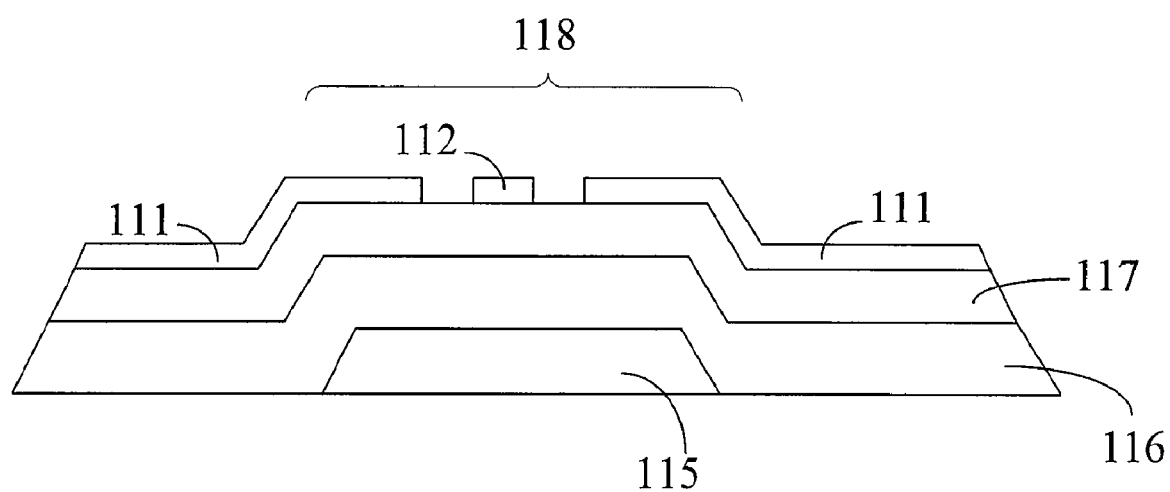
FIG. 2 is a schematic diagram of a partial sectional view of the first embodiment.

FIG. 2 is a cross-sectional view of the primary TFT 11 sectioned along an AA' line in FIG. 1, wherein a silicon nitride layer 116 is located between the gate electrode 115 and the working area 118. The silicon nitride layer 116 acts as a dielectric layer, while the channel layer is found beneath the first electrode 111 and the second electrode 112. In this embodiment, the channel layer can be an amorphous silicon layer 117 electrically connected to the first electrode 111 and the second electrode 112 to provide a channel for carriers flow. The auxiliary TFT 12 is similar to the primary TFT 11 in cross-sectional structure.

Figure 3:
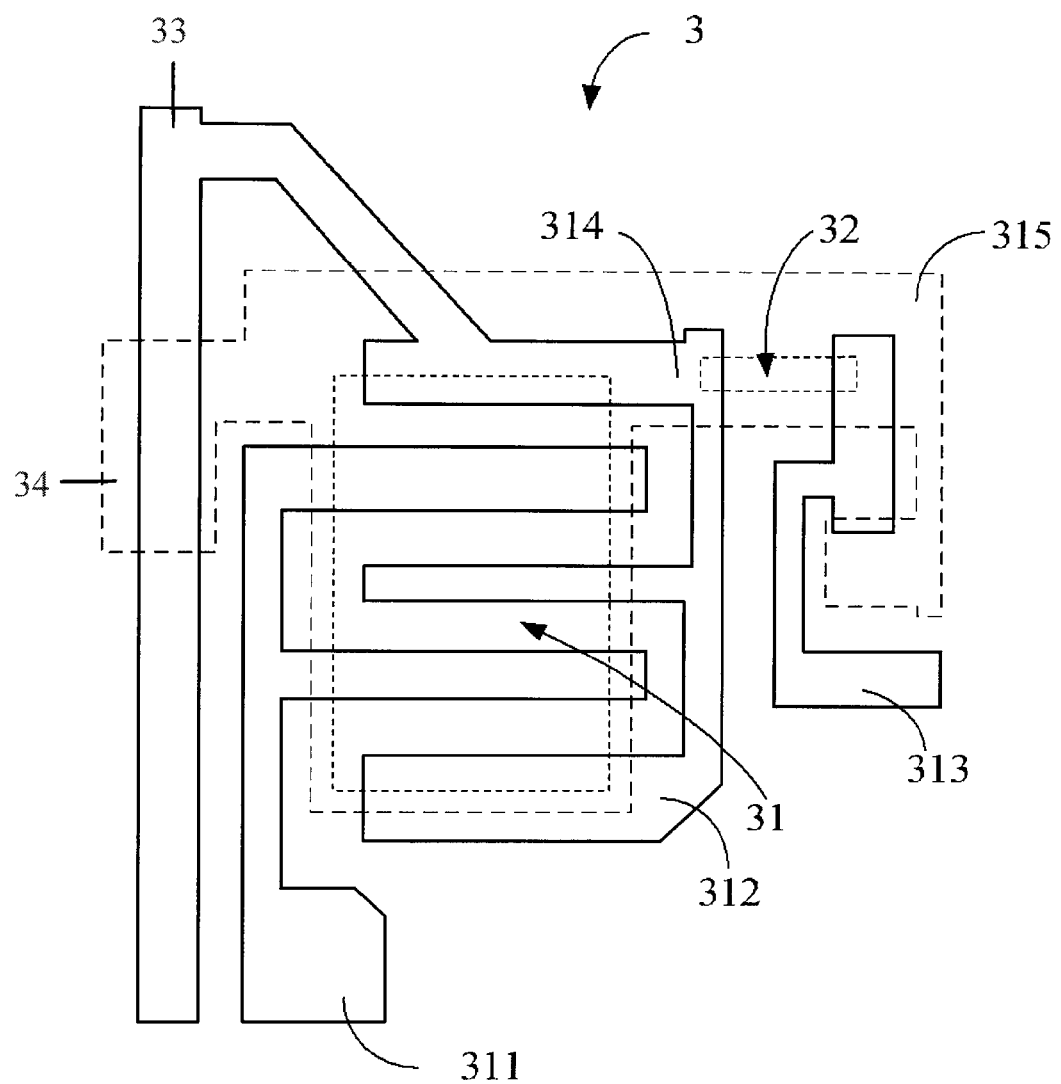
FIG. 3 is a schematic diagram illustrating the top view of a second embodiment of the invention.

FIG. 3 is a schematic diagram illustrating the top view of the TFT structure 3 of the second embodiment of the invention. The TFT structure 3 comprises a primary TFT 31 and an auxiliary TFT 32. The primary TFT 31 and the auxiliary TFT 32 are also electrically connected to each other in parallel and share a gate electrode 315 connecting to the LCD scanning line 34, wherein the primary TFT 31 comprises a first electrode 311 and a second electrode 312, which connect to the drain and source of the primary TFT 31 respectively. Similarly, the auxiliary TFT 32 comprises a third electrode 313 and a fourth electrode 314 which connect to the drain and source of the auxiliary TFT 32, respectively. The second electrode 312 electrically connects to the fourth electrode 314, while the first electrode 311 and the third electrode 313 connects to different pixel electrodes (not shown). Meanwhile, the second electrode 312 connects to a data line 33.

In this embodiment, within an area overlapping the gate electrode 315, a working area is formed between the channel, which is located between the drain and source, and the gate electrode 315. The first electrode 311 comprises two branches disposed in the center of the working area, while the second electrode 312 comprises three branches which are respectively disposed in the center area and two sides of the working area. The branches of the first electrode 311 and the second electrode 312 are arranged in an interleave fashion, i.e. branches of the second electrode 312 are respectively disposed on two sides of the branches of the first electrode 311 and are parallel to each other for maintaining uniform TFT channel lengths. The first electrode 311 overlaps with the gate electrode 315 in a direction normal to the channel and extends outside the working area. That is, the first electrode 311 overlaps with the working area and extends outside the working area. In this embodiment, each branch of the first electrode 311 has a horizontal size, i.e. a width, of about 1~10 μm, preferably 4~7 μm. The center branch of the second electrode 312 comprises a horizontal size, i.e. a width, of about 1~10 μm, preferably 4~7 μm. The two overlapping regions of the second electrode 312 and the gate electrode 315, i.e. the two overlapping areas between the two side branches and the gate electrode 315, respectively, have a horizontal size, i.e. a width, of about 1~10 μm, preferably 4~7 μm. When manufacturing process parameters deviate, such as the deviation resulting from the misalignment of the first electrode 311 during the manufacturing process, the left side of the first electrode 311 that extends outside the working area may deviate to the right. Meanwhile, the right side of the first electrode 311 that extends outside the working area deviates to the right synchronously. Consequently, the total overlapping area between the working area and the first electrode 311 remains the same. Similarly, the total overlapping area between the first electrode 311 and the gate electrode 315 also remain the same. Like the first embodiment, the total overlap area of the first electrode 311 and the gate electrode 315 does not change and the parasitic capacitance between the gate and the drain of the primary TFT 31 remain stable without being affected by the deviation generated during the manufacturing process.

Furthermore, in this embodiment, the auxiliary TFT 32 also relies on the structure to maintain a stable parasitic capacitance when deviation occurs during the manufacturing process. The fourth electrode 314 of the auxiliary TFT 32 and the second electrode 312 are directly connected. The gate electrode 315 of the auxiliary TFT 32 comprises an indented shape so that the center area portion does not overlap with the gate electrode 315 and only two sides and the gate electrode 315 form two overlaps when the third electrode 313 extends outside the working area. Herein, when manufacturing parameter deviation occurs, such as the deviation resulting from the misalignment of the third electrode 313 during the manufacturing process, the whole third electrode 313 synchronously deviates. Consequently, the total overlap area of the first electrode 313 and the gate electrode 315 does not change and the parasitic capacitance between the gate and the drain of the auxiliary TFT 32 maintain stability without being affected by the deviation generated during the manufacturing process. Meanwhile, since no extra compensating capacitor is required, the parasitic capacitance will not increase significantly when the TFT structure area is enlarged to obtain a higher conduction current.

In this embodiment, the design rules of the first electrode 311 and the third electrode 313 are the same as those of the first embodiment; thus, the details are omitted here. Alternatively, the first electrode 311 and the third electrode 313 can also extend out in the direction parallel to the channel as well.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A pixel structure for a liquid crystal display (LCD), comprising:
    a scanning line, a data line, a first pixel electrode and a second pixel electrode; and
    a thin film transistor (TFT) structure, comprising:
        a gate electrode, connecting to the scanning line;
        a dielectric layer, covering the gate electrode;
        a first patterned channel layer, disposed on the dielectric layer and above the gate electrode;
        a second patterned channel layer, disposed on the dielectric layer and above the gate electrode adjacent to the first patterned channel layer;
        a first electrode, including two branches, disposed on a portion of the first patterned channel layer, the first electrode being electrically connected to the first pixel electrode;
        a second electrode, connected to the data line, the second electrode disposed on another portion of the first patterned channel layer and a portion of the second patterned channel layer, the second electrode including three branches, the first electrode being parallel to the second electrode, and the three branches of the second electrode and the two branches of the first electrode being disposed alternatively on the first patterned channel layer, wherein the gate electrode, the dielectric layer, the first patterned channel layer, the first electrode and the second electrode construct a primary TFT structure with a plurality of first channels being formed within the first patterned channel layer and extending along a first direction substantially parallel to the data line; and
        a third electrode, disposed on another portion of the second patterned layer, the third electrode electrically connected to the second pixel electrode, wherein the gate electrode, the dielectric layer, the second patterned channel layer, the second electrode and the third electrode construct an auxiliary TFT structure with only one second channel being formed within the second patterned channel layer and extending along a second direction substantially perpendicular to the data line;
    wherein a channel width-to-length (W-L) ratio of each of the plurality of first channels of the primary TFT structure is larger than a channel width-to-length (W-L) ratio of the second channel of the auxiliary TFT structure.

2. The pixel structure of claim 1, wherein a material of the first dielectric layer comprises silicon nitride.

3. The pixel structure of claim 1, wherein one of the first electrode and the second electrode is a source electrode of the primary TFT structure and the other of the first electrode and the second electrode is a drain electrode of the primary TFT structure.

4. The pixel structure of claim 1, wherein a material of the channel layer comprises amorphous silicon.

5. The pixel structure of claim 1, wherein each of the branches of the first electrode comprises a horizontal size of about 1-10 micrometers.

6. The pixel structure of claim 1, wherein the branch intermediate the other two branches of the second electrode comprises a horizontal size of about 1-10 micrometers.

7. The pixel structure of claim 1, wherein each of the side branches of the second electrode overlaps the gate electrode for a horizontal size of about 1-10 micrometers.

8. The pixel structure of claim 1, wherein the third electrode and the gate electrode form an overlapping area.

9. The pixel structure of claim 1, wherein the second electrode comprises a fourth electrode disposed on the portion of the second patterned channel layer.

10. The pixel structure of claim 1, wherein the gate electrode at the auxiliary TFT structure is formed with an indented configuration.

11. A thin film transistor (TFT) structure for a pixel structure of a liquid crystal display (LCD), the pixel structure including a scanning line, a data line, a first pixel electrode and a second pixel electrode, the TFT structure comprising:
    a gate electrode, connecting to the scanning line;
    a dielectric layer, covering the gate electrode;
    a first patterned channel layer, disposed on the dielectric layer and above the gate electrode;
    a second patterned channel layer, disposed on the dielectric layer and above the gate electrode adjacent to the first patterned channel layer;
    a first electrode, including two branches, disposed on a portion of the first patterned channel layer, the first electrode being electrically connected to the first pixel electrode;
    a second electrode, connected to the data line, the second electrode disposed on another portion of the first patterned channel layer and a portion of the second patterned layer, the second electrode including three branches, the first electrode being parallel to the second electrode, and the three branches of the second electrode and the two branches of the first electrode being disposed alternatively on the first patterned channel layer, wherein the gate electrode, the dielectric layer, the first patterned channel layer, the first electrode and the second electrode construct a primary TFT structure with a plurality of first channels being formed within the first patterned channel layer and extending along a first direction substantially parallel to the data line; and a third electrode, disposed on another portion of the second patterned layer, the third electrode electrically connected to the second pixel electrode, wherein the gate electrode, the dielectric layer, the second patterned channel layer, the second electrode and the third electrode construct an auxiliary TFT structure with only one second channel being formed within the second patterned channel layer and extending along a second direction substantially perpendicular to the data line;

wherein a channel width-to-length (W-L) ratio of each of the plurality of first channels of the primary TFT structure is larger than a channel width-to-length (W-L) ratio of the second channel of the auxiliary TFT structure.

* * * * *